(12) United States Patent
Shirazi et al.

(10) Patent No.: US 7,085,976 B1
(45) Date of Patent: Aug. 1, 2006

(54) METHOD AND APPARATUS FOR HARDWARE CO-SIMULATION CLOCKING

(75) Inventors: Nabeel Shirazi, San Jose, CA (US); Singh Vinay Jitendra, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 379 days.

(21) Appl. No.: 10/370,023

(22) Filed: Feb. 18, 2003

(51) Int. Cl. *G01R 31/28* (2006.01)

(52) U.S. Cl. ............... 714/725; 714/30; 714/733

(58) Field of Classification Search ........... 714/724, 714/744, 733, 738, 729, 727, 726, 30; 713/500; 324/765; 385/233
See application file for complete search history.

(56) References Cited

U.S. PATENT DOCUMENTS

| | | | |
|---|---|---|---|
| 5,519,715 A * | 5/1996 | Hao et al. | 714/727 |
| 5,524,114 A * | 6/1996 | Peng | 714/724 |
| 6,418,545 B1 * | 7/2002 | Adusumilli | 714/729 |
| 6,598,192 B1 * | 7/2003 | McLaurin et al. | 714/726 |
| 6,651,181 B1 * | 11/2003 | Lacey | 713/503 |
| 6,671,848 B1 * | 12/2003 | Mulig et al. | 714/744 |
| 6,687,866 B1 * | 2/2004 | Fukuda | 714/733 |
| 2002/0138801 A1 * | 9/2002 | Wang et al. | 714/729 |
| 2003/0009714 A1 * | 1/2003 | Evans | 714/726 |
| 2003/0070118 A1 * | 4/2003 | Nakao et al. | 714/30 |
| 2003/0094934 A1 * | 5/2003 | Date et al. | 324/73.1 |
| 2003/0106004 A1 * | 6/2003 | Ricchetti et al. | 714/733 |

OTHER PUBLICATIONS

Lytech Signal Processing (LSP); Technical Note (TN-102); "Host-Signal/Master FPGA co-simulation with MATLAB/Simulink & Xilinx's System Generators and LSP'S FPGALink"; available from http://www.signal-lsp.com/applications/notes.html; Feb. 13, 2003; pp. 1-4.

* cited by examiner

Primary Examiner—Guy Lamarre
Assistant Examiner—John P. Trimmings
(74) Attorney, Agent, or Firm—W. Eric Webostad

(57) ABSTRACT

Method and apparatus for hardware co-simulation clocking is described. More particularly, single-step clocking is used to load one or more test vectors and to output test results from such test vectors after processing. The test vectors are processed with the hardware using a free-running clock, for example to speed up test time and to generate information related to operational speed. A simulation of the hardware is used, where single-step clocking out the test results facilitates verification of the hardware test results with simulation test results.

24 Claims, 5 Drawing Sheets

METHOD AND APPARATUS FOR HARDWARE CO-SIMULATION CLOCKING

FIELD OF THE INVENTION

One or more aspects of the invention generally relate to hardware clocking, and more particularly to hardware clocking for co-simulation.

BACKGROUND OF THE INVENTION

Classically, hardware design begins with what is known as a design specification, which is typically a textual description of what is to be designed. Conventionally, in "top-down" design, a design specification is used to generate a hardware description language ("HDL") representation. Examples of HDLs are Verilog (from Cadence of San Jose, Calif.), SystemC (from Synopsys of Mountain View, Calif.) and Very High Speed Integrated Circuit ("VHSIC") HDL ("VHDL").

A design described with an HDL is a functional description, which is converted ("synthesized") into a text-circuit description using one or more synthesizer tools or programs. Tools for mapping, placing, and routing of components/signals are used to implement this synthesis.

In the context of programmable logic devices (PLDs), such as complex programmable logic devices (CPLDs), field programmable gate arrays (FPGAs) and other integrated circuits with programmable logic, a design may be implemented with a configuration bitstream. A configuration bitstream may be written to and read from an external memory coupled to the FPGA. Individual memory cells of internal FPGA memory are programmed with such configuration bitstream to cause at least a programmable logic portion of the FPGA to function as the design. For purposes of clarity, an FPGA integrated circuit is described, though it will be apparent that any integrated circuit of sufficient complexity designable with synthesis tools may be implemented.

Complexity and runtime for simulating has increased with an increase in the number of gates on an integrated circuit and with an increase in the number of test vectors used to verify performance, especially with respect to heterogeneous integrated circuits like "System-on-Chips" (SoCs). For example, an FPGA may include one or more embedded cores. Such embedded cores may include one or more digital signal processors (DSPs), microprocessors, microcontrollers, dedicated logic (Application Specific Integrated Circuits (ASICs)), multipliers, and memory, among other known integrated circuits. Adding to this complexity, one or more embedded core designs may be from one or more entities other than the designing entity of the FPGA. For clarity, an FPGA with an embedded DSP is described, though it will be apparent that other SoCs may be used.

Less conventionally, to speed up design simulation, a "high-level" of abstraction simulation has emerged. By "high-level", it is meant simulation using a programming language in contrast to a "low-level" of abstraction simulation using an HDL representation of a design. For example, hardware-oriented concepts are described in C-code, such as C++, and provided as a library of classes. These classes may be used to model a design specification, which model may be compiled into an executable design file. This executable design file is a software simulation of a design, which may be used to validated design operation prior to implementation of a synthesizable HDL version.

Returning to the above example of a FPGA/DSP SoC, System Generator for DSP from Xilinx of San Jose, Calif., is a software tool for modeling and designing FPGA-based digital signal processing systems developed with MATLAB and Simulink from The MathWorks of Natick, Mass. System Generator for DSP may be used to translate a software simulation of a design into an HDL version of a design, including embedded cores. Accordingly, a software simulation for an SoC is converted into synthesizable HDL for hardware implementation.

However, conventional verification that a software simulation operates equivalently to its hardware implementation counterpart is problematic. Conventionally, a software simulation is run in parallel with its hardware implementation counterpart ("hardware-software co-simulation" or just "co-simulation"), where software simulation and hardware implementation respective results from test vector stimulus are compared at each clock cycle. To ensure a hardware implementation is synchronous with its software simulation counterpart, a gated clock pulse is supplied to the hardware implementation after each simulation step. This type of test clocking is known as "single-step clocking" or "single-step clock." Running through a set of test vectors using single-step clocking consumes significant amounts of time.

Furthermore, single-step clocking test results do not necessarily reflect operating speed of a hardware implementation, for example, a hardware implementation may operate slower than its software simulation counterpart. Thus, once a designer is satisfied that a hardware implementation meets some threshold of functional equivalence with its software simulation counterpart, as evidenced by a successful run through of a set of test vectors with single-step clocking, test time for simulating the hardware implementation and the software simulation may be reduced by applying a "free-running" clock signal. By "free-running" clock signal, it is meant that clock pulses are provided with periodicity not related to gating, where each pulse in a single-step clock signal is deterministically or controllably applied. Thus, if gated, a free-running clock signal is provided to an implemented design in a pass through manner in contrast to a single-step clock.

Application of a free-running clock facilitates both loading more test vectors than single-step clocking and facilitates determining maximum operating speed of the hardware implementation. However, use of a free-running clock signal means that clock domains of co-simulated software simulation and hardware implementation are not coupled. Thus, test data input and test data output sampling is done asynchronously, making test data correlation between software simulation and hardware implementation cumbersome.

Accordingly, it would be both desirable and useful to provide simulation means that involves less time intensive test data correlation as compared with a single-step clocking test mode and where there is improved test data correlation as compared with a free-running clocking test mode.

SUMMARY OF THE INVENTION

An aspect of the invention is a method for testing an integrated circuit, comprising: applying a single-step clock signal to the integrated circuit; loading at least one test vector into the integrated circuit with the single-step clock signal; applying a free-running clock signal to the integrated circuit; operating the integrated circuit using the free-running clock signal to process the at least one test vector; and re-applying the single-step clock signal to obtain test data from the integrated circuit responsive to the at least one test vector processed.

Another aspect of the invention is a method for testing an implementation of an integrated circuit, comprising: applying a single-step clock signal to the implementation; loading test vectors under control of the single-step clock signal for the implementation; applying a free-running clock signal to the implementation after loading the test vectors; waiting for the implementation to process the test vectors using the free-running clock signal; and re-applying the single-step clock signal to obtain test data responsive to the test vectors processed by the implementation.

Another aspect of the invention is a method for testing an integrated circuit, comprising: obtaining a software simulation of the integrated circuit; translating the software simulation into a hardware description language version thereof; synthesizing the hardware description language version into a hardware implementation; and selecting a test mode from a plurality of test modes. The test mode selected: couples the hardware implementation and the software simulation to a first clock domain for synchronously providing test vectors to the hardware implementation; decouples the hardware implementation from the first clock domain and couples the hardware implementation to a second clock domain not coupled to the software simulation for processing the test vectors in the second clock domain with the hardware implementation, the second clock domain substantially greater in frequency than the first clock domain; and re-couples the hardware implementation to the first clock domain for synchronously obtaining test data responsive to the test vectors processed in the second clock domain.

Another aspect of the invention is a method for testing a hardware implementation of an integrated circuit from a software simulation of the integrated circuit, comprising: coupling the hardware implementation and the software simulation to a first clock domain for synchronously providing test vectors to the hardware implementation; decoupling the hardware implementation and the software simulation from the first clock domain and coupling the hardware implementation to a second clock domain not coupled to the software simulation for processing the test vectors in the second clock domain with the hardware implementation, the second clock domain substantially greater in frequency than the first clock domain; and coupling the hardware implementation and the software simulation to a third clock domain for synchronously obtaining test data responsive to the test vectors processed in the second clock domain.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
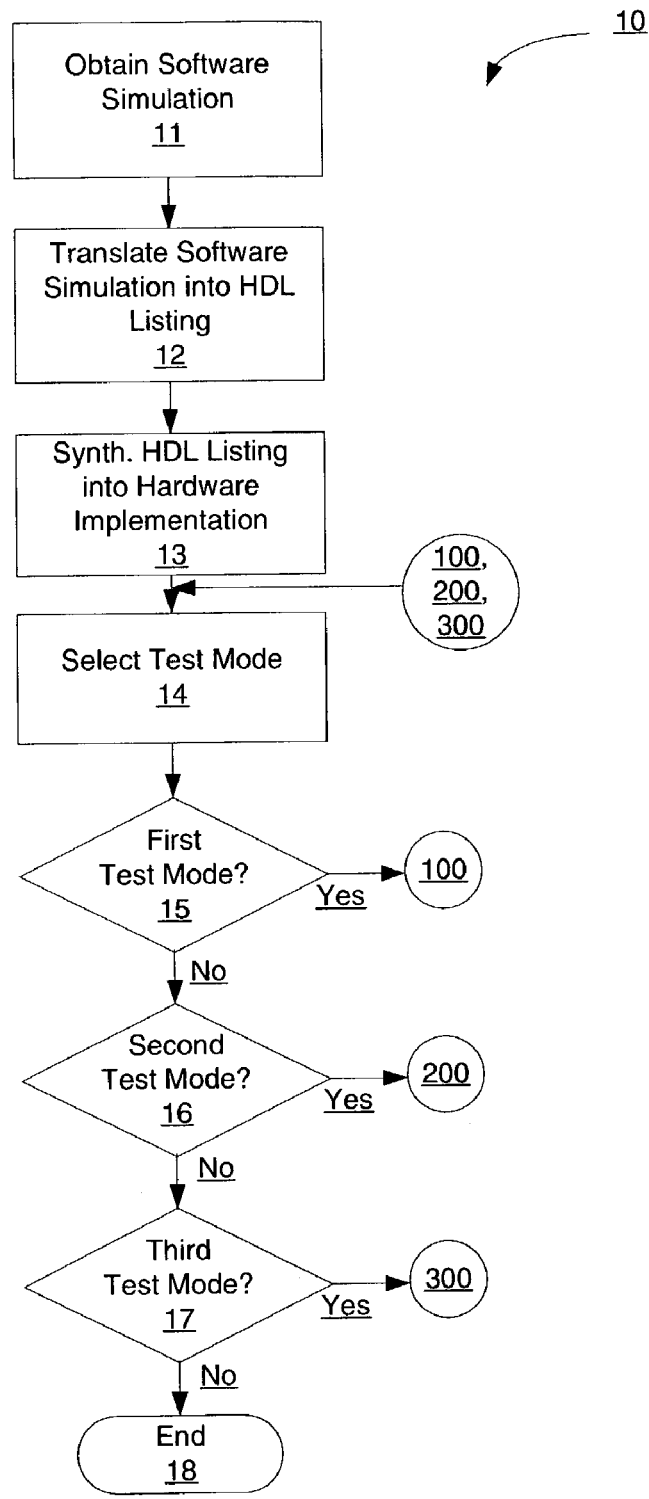
FIG. 1 is a flow diagram of an exemplary embodiment of a test process in accordance with one or more aspects of the invention.

FIG. 1 is a flow diagram of an exemplary embodiment of a test process 10 in accordance with one or more aspects of the invention. At 11, a software simulation for a design to be tested is obtained. At 12, the software simulation obtained at 11 is translated into an HDL listing. At 13, the HDL listing is synthesized to into a hardware implementation.

Continuing the example from above, hardware implementation 13 may be a design under test programmed into at least a portion of programmable logic of an FPGA. Again, this hardware implementation may extend beyond programmable logic and may include one or more embedded cores, such as a DSP in the above example.

At 14, a test mode is selected. A user may do this manually. At 14, there are three different test modes from which to choose. If, at 15, it is determined that a single-step clocking test mode is selected, then at 15 a test mode 100 is called. This test mode is a conventional single-step clocking test mode where time domains for software simulation 11 and hardware implementation 13 are coupled.

If, at 14, a free-running clocking test mode is selected, then at 16 test mode 200 is called. This test mode is a conventional free-running clock test mode where time domains for software simulation 11 and hardware implementation 13 are not coupled.

If, at 14, a single-step/free-running clocking test mode is selected, then at 17 test mode 300 is called. This test mode is a single-step/free-running clock test mode where time domains for software simulation 11 and hardware implementation 13 are coupled for input of test vectors and output of test results and are not coupled for processing of test vectors.

If, at 14, no test mode is selected, then test process 10 ends at 18.

Figure 2:
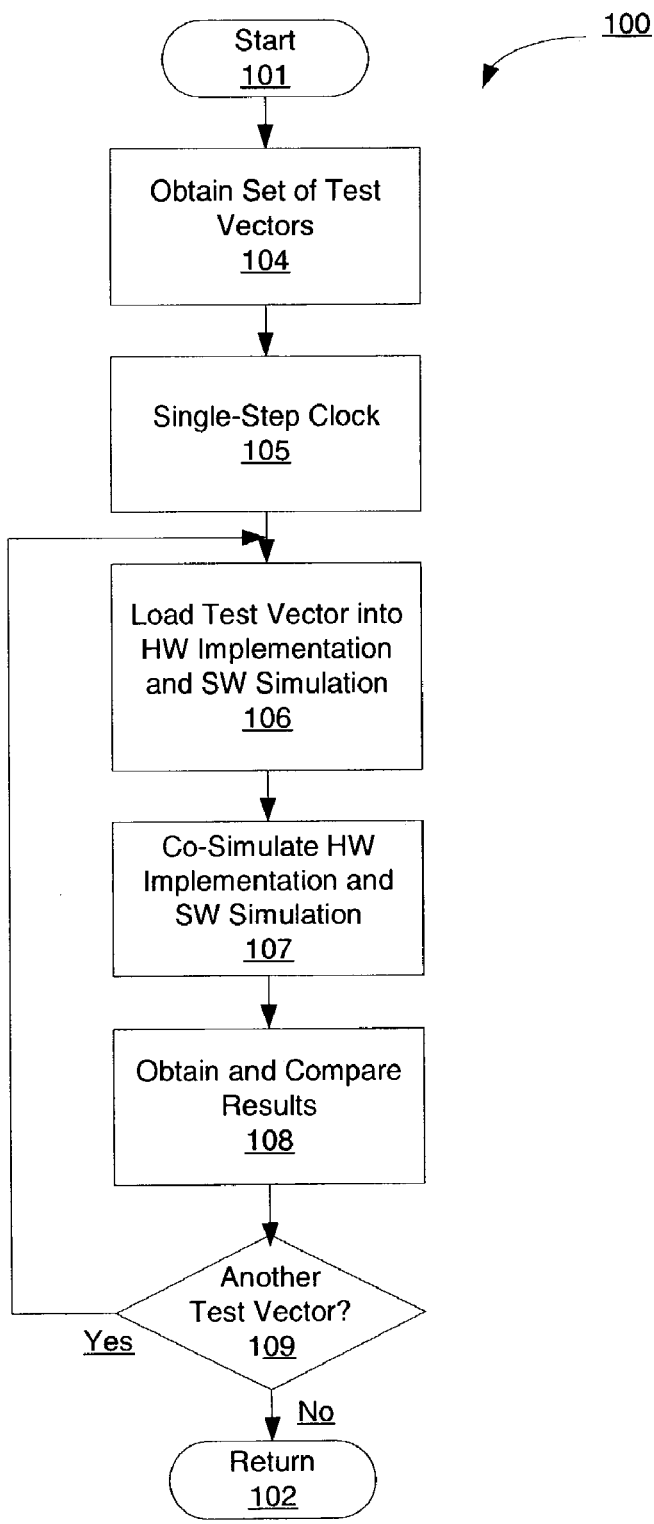
FIG. 2 is a flow diagram of an exemplary embodiment of a test mode of the prior art.

FIG. 2 is a flow diagram of an exemplary embodiment of a test mode 100 of the prior art. In response to selection of a single-step clocking test mode at 14, test mode 100 is initiated at 101. At 104, a set of test vectors is obtained for use with single-step clocking. As mentioned above, this set of test vectors may be specific for use with test mode 100.

At 105, single-step clocking of a hardware implementation begins. At 106, a test vector 104 is loaded into hardware implementation 13 and software simulation 11 with a single pulse from a single-step clock. Notably, conventionally software simulation 11 has a file of test vectors or generates test vectors. Test vectors may be analog or digital, and in implementations analog test vectors may be converted with an analog-to-digital converter for application.

At 107, software simulation 11 and hardware implementation 13 are co-simulated with single-step clocking. Continuing the above example for single-step clocking for hardware implementation 13, a clock pulse is applied to a design programmed into an FPGA after each simulation cycle of software simulation 11. By simulation cycle, it is meant loading a test vector with an applied clock pulse to an implemented design and obtaining an output in at least partial response to the test vector applied. Notably, it is not necessary to co-simulate at 107, as software simulation 11 need not be run thus relying on previously obtained test results. However, such previously obtained test results are still clocked out with single-step clocking to synchronize outputs of software simulation 11 and hardware implementation 13 for purposes of comparison.

At 108, each response to a test vector input at 104 is obtained for a simulation cycle synchronously as between software simulation 11 and hardware implementation 13 for comparison. Thus, after each clock cycle, test results may be obtained from hardware implementation 13 and software simulation 11. By running software simulation 11 and hardware implementation 13 in parallel with single-step clocking, results are compared for each clock cycle for each simulation step.

Test results obtained at 108 may be read into a computing environment, such as that for software simulation 11, for comparison, including data analysis and data visualization, for verification of design functionality.

At 109, a check for another test vector to be applied is made. If all test vectors obtained at 104 have not been processed, then a next test vector is loaded at 106. If all test vectors have been processed, then at 102, test mode 100 returns to test mode selection 14 of FIG. 1.

test mode 100 may be, though need not be, selected first for an initial evaluation of an implemented design's basic functionality using a limited set of test vectors for this goal. If such basic functionality is not achieved, it may be decided at 14 to end co-simulation test process 100. However, once such basic functionality has been verified, it may be decided not to run test mode 100 again. For example, it may be decided not to re-run test mode 100 on a design having one or more incremental design changes used to enhance performance.

Figure 3:
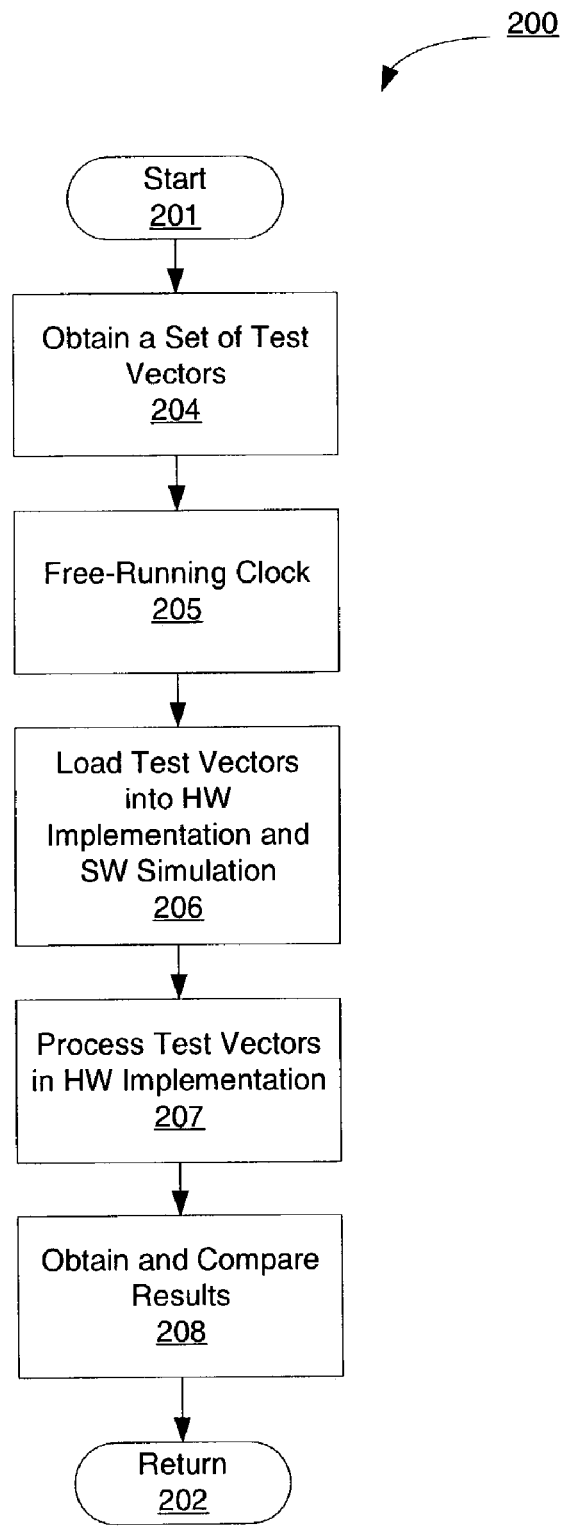
FIG. 3 is a flow diagram of an exemplary embodiment of a another test mode of the prior art.

FIG. 3 is a flow diagram of an exemplary embodiment of a test mode 200 of the prior art. In response to selection of a free-running clocking test mode at 14, test mode 200 is initiated at 201. At 204, a set of test vectors is obtained for use with free-running clocking. This set of test vectors may be specific for use in test mode 200.

At 205, if not already applied to a hardware implementation 13, a free-running clock is applied to hardware implementation 13.

At 206, one or more test vectors 204 are loaded into hardware implementation 13. These test vectors 204 may be for one or more complex test algorithms individually or collectively taking a substantial amount of time to process through hardware implementation 13 making use of free-running clocking desirable. Alternatively or in addition to loading test vectors, test vectors may be generated inside hardware implementation 13 with known test vector generator circuitry.

At 207, hardware implementation 13 is simulated with free-running clocking. Co-simulation may, though need not, be done to obtain software simulation 11 test results for comparison. Alternatively, previously generated software simulation 11 test results may be used. Continuing the above example for free-running clocking for hardware implementation 13, a free-running clock signal is applied to a design programmed into an FPGA.

At 208, each response to test vectors input at 204 are obtained from hardware implementation 13 for comparison with software simulation 11 test results. Notably, test results need not be obtained at an end of processing all test vectors 204, rather test results may be sampled asynchronously at sampling points by having FPGA provide flags to software simulation 11 indicating such sampling points. However, a single flag at the end of all processing may be used to obtain all test results, where registers may be used to hold interim and ending test results for comparison with software simulation 11 test results. Accordingly, input registers or other storage devices to a design under test are asynchronously set and output registers or other storage devices are asynchronously sampled after one or more simulation cycles have occurred. Test results sampled at 208 may be read into a computing environment, such as that for software simulation 11, for comparison, including data analysis and data visualization, for verification of design functionality and performance. At 202, test mode 200 returns to test mode selection 14 of FIG. 1.

Figure 4:
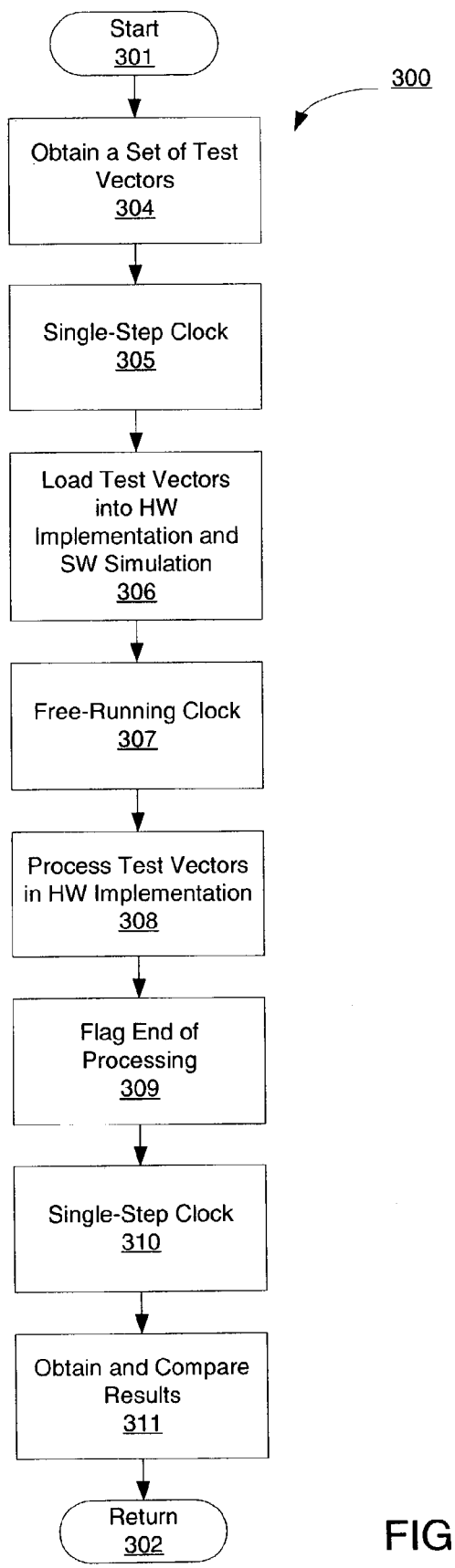
FIG. 4 is a flow diagram of an exemplary embodiment of a test mode in accordance with one or more aspects of the invention.

FIG. 4 is a flow diagram of an exemplary embodiment of a test mode 300 in accordance with one or more aspects of the invention. In response to selection of a single-step/free-running clocking test mode at 14, test mode 300 is initiated at 301. At 304, a set of test vectors is obtained for use with test mode 300. This set of test vectors may be specific for use with test mode 300, or may be the same set of test vectors used with either or both test mode 100 or 200.

At 305, single-step clocking begins. At 306, one or more test vectors 304 are loaded into hardware implementation 13 with single-step clocking. Notably, it is not necessary to co-simulate, as software simulation 11 need not be run thus relying on previously obtained test results to test vectors.

At 307, a free-running clock is applied to hardware implementation 13. At 308, hardware implementation 13 processes test vectors 304 while being clocked with a free-running clock.

At 309, a flag is asserted to indicate end of processing by hardware implementation 13 of test vectors 304. Alternatively or in addition, a wait state may be invoked until processing by hardware implementation 13 has timed-out to avoid extended waiting for a stalled process.

At 310, after hardware implementation 13 has processed test vectors 304, single-step clocking is re-applied to both software simulation 11 and hardware implementation 13. This does not have to be the same single-step clock signal as applied at 305, so at 310 another single-step clock signal may be applied. In either embodiment, time domains for software simulation 11 and hardware implementation 13 are coupled for synchronous operation. In other words, test data output bits for software simulation 11 and hardware implementation 13 are synchronously output for a bit-to-bit and cycle accurate correspondence for purposes of comparison for correlation. If co-simulation is not done at 308, previously obtained test results are still clocked out with single-step clocking to synchronize outputs of software simulation 11 and hardware implementation 13 for purposes of comparison.

At 311, test results are single-step clocked synchronously out of hardware implementation 13 for comparison with test results from software simulation 11. Test results obtained at 311 may be read into a computing environment, such as that for software simulation 11, for comparison, including data analysis and data visualization, for verification of design functionality and performance. At 302, test mode 300 returns to test mode selection 14 of FIG. 1.

Figure 5:
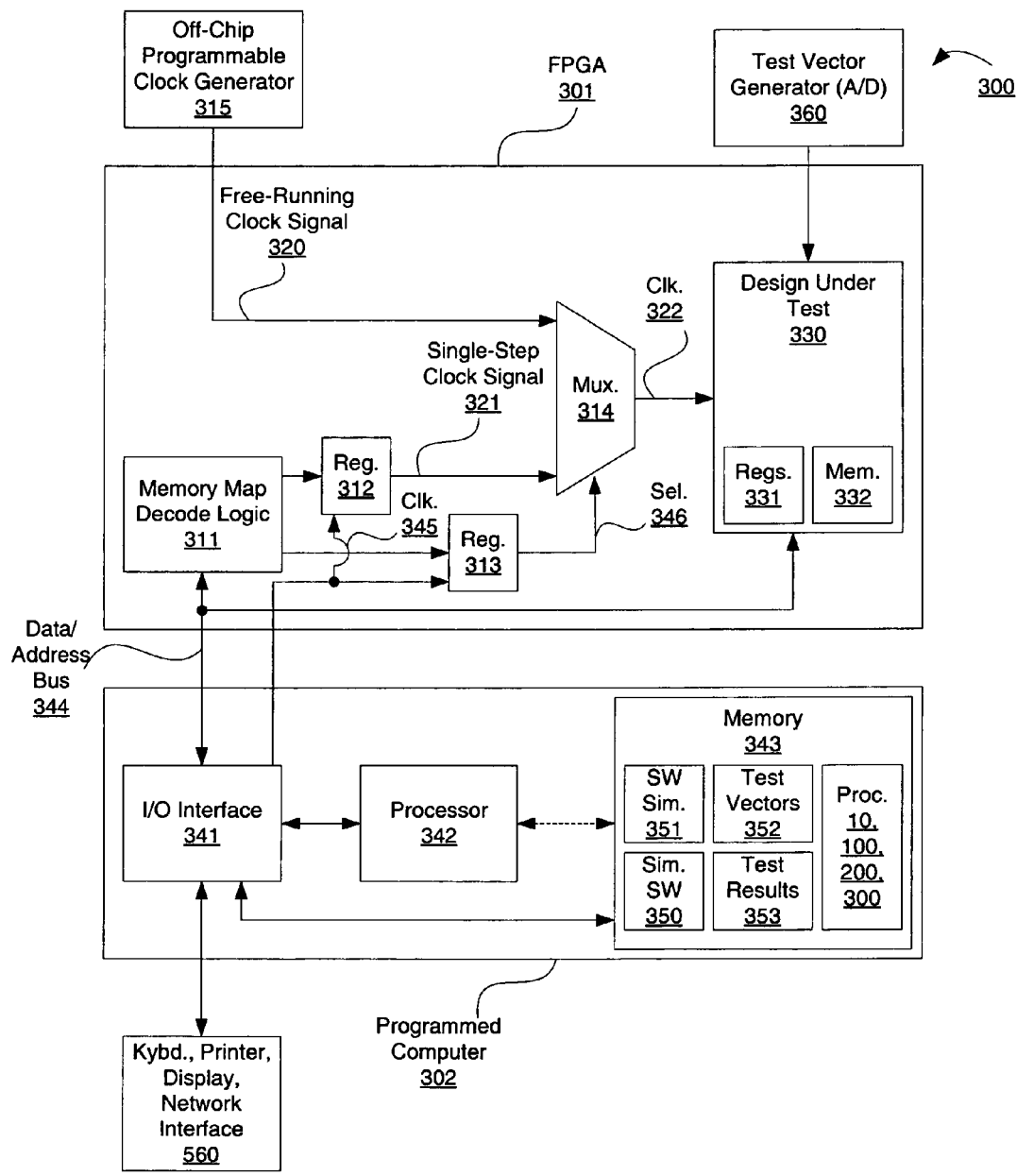
FIG. 5 is a block diagram of an exemplary embodiment of a test system in accordance with one or more aspects of the invention.

FIG. 5 is a block diagram of an exemplary embodiment of a test system 300 in accordance with one or more aspects of the invention. Test system 300 comprises a programmed computer ("test bench") 302 and a free-running clock source 315 and an implemented design under test 330. Continuing the above example, design under test 330 may be implemented in FPGA 301. However, alternatively, FPGA 301 circuitry used to communicate with design under test 330 may be on a test card. Free-running clock source 315 may be from a programmable clock generator located off-chip with respect to FPGA 301 to provide a free-running clock signal 320 to FGPA 301. Programmed computer 302 is in communication with FPGA 301 via bi-directional data/address bus 344, which provides a memory map interface suitable for communication with processor 342 of programmed computer 302.

Programmed computer 302 may be coupled to devices 560, such as a keyboard, a cursor pointing device, a printer and a display device, as well as other known input, output and input/output devices, including a computer network interface. Programmed computer 302 comprises input/output interface 341 coupled to processor 342 and to memory 343. Memory 343 may additionally or alternatively be directly coupled to processor 342.

Programmed computer 302 is programmed with an operating system, which may be OS/2, Java Virtual Machine, Linux, Solaris, Unix, Windows, Windows95, Windows98, Windows NT, and Windows2000, WindowsME, and WindowsXP, among other known platforms. At least a portion of an operating system may be disposed in memory 343. Memory 343 may include one or more of the following random access memory, read only memory, magneto-resistive read/write memory, optical read/write memory, cache memory, magnetic read/write memory, and the like, as well as other signal-bearing media as set forth below. Memory 343 may further include a software simulation 351 for design under test 330, simulation and test bench software 350, and test vectors 352 and test results 353 as described above. Test vectors 352 may be stored in memory 343 and then stored in block memory 332 of FPGA 301 after loading, which block memory may be external to or part of or both for design under test 330. Alternatively or in addition, an off-chip test vector generator 360 with an analog-to-digital converter may be used to provide test vectors to design under test 330.

An aspect of the invention is implemented as a program product for use with a programmed computer such as, for example, process 300, as well as optionally process 10, including process 300 and one or more of processes 100 and 300, all or a portion of which may be in memory 343. Program(s) of the program product defines functions of embodiments and can be contained on a variety of signal-bearing media, which include, but are not limited to: (i) information permanently stored on non-writable storage media (e.g., read-only memory devices within a computer such as CD-ROM or DVD-RAM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Such signal-bearing media, when carrying computer-readable instructions that direct functions of the invention, represent embodiments of the invention.

Free-running clock signal 320 and single-step clock signal 321 are applied to inputs of a select circuit, such as a multiplexer 314, for selecting one of the two clock signals in response to a selection control signal, such as select signal 346, provided to multiplexer 314. Multiplexer 314 may be a global buffer multiplexer of FPGA 301. Accordingly, test mode clock signal 322 provided to design under test 330 is either free-running clock signal 320 or single-step clock signal 321.

Registers 312 and 313 are memory mapped registers using memory map and decode logic 311. In an FPGA embodiment, memory map and decode logic 311 may be programmed into a programmable logic portion of FPGA 301.

Select signal 346 is controlled by programmed computer 302 writing a logic "1" or a logic "0" to register 313 via memory map and decode logic 311, depending on which of free-running clock signal 320 or single-step clock signal 321 is to be selected. Register 312 is used for single-step clocking under control of programmed computer 302. Programmed computer 302 writes via memory map and decode logic 311 a logic "1" followed by a logic "0" to register 312 thus producing a clock pulse. This type of register control allows for data setup and hold time for providing a test vector from programmed computer 302 to design under test 330 via bi-directional address/data bus 344.

Where conventionally single-step clocking is measured in kilohertz as compared to free-running clocking which conventionally is measure in megahertz, namely, clock signals 321 and 320 are orders of magnitude apart. Additionally, both registers 312 and 313 may be clocked by an external clock signal, directly such as with external clock signal 345 provided from programmed computer 302 or indirectly through a digital clock manager of FPGA 301.

Test system 300 allows a user to select at run-time of test mode 300 of FIG. 4 between application of a free-running clock signal 320 and a single-step clock signal 321 to a design under test 330. Test system 300 allows test vectors 352 to be synchronously loaded with single-step clock signal 321 into design under test 330 with respect to a software simulation 351 running on programmed computer 302. Once design under test 330 has test vectors 352 loaded, computation or other processing of test vectors 352 is done with design under test 330 operating under free-running clock signal 320 for enhance processing speed over single-step clocking. Test results may be stored in test data registers 331, which may be part of design under test 330 or part of FPGA 301 or both. After processing test vectors 352, single-step clocking is used for synchronously reading test results from design under test 330 to programmed computer 302 via data/address bus 344. This, in addition to synchronizing test data results from design under test 330 and software simulation 351, allows for such data to be analyzed and visualized using simulation software 350.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. All trademarks are the property of their respective owners.

The invention claimed is:

1. A method for testing an integrated circuit, comprising:
obtaining test results from a software simulation of the integrated circuit;
applying a single-step clock signal to the integrated circuit;
loading at least one test vector into the integrated circuit with the single-step clock signal;
applying a free-running clock signal to the integrated circuit, the free-running clock signal being associated with an operating frequency of the integrated circuit;
operating the integrated circuit using the free-running clock signal to process the at least one test vector;
re-applying the single-step clock signal to obtain test data from the integrated circuit responsive to the at least one test vector processed; and comparing the test results and the test data in synchronous bit-to-bit correspondence using the re-applying of the single-step clock signal.

2. The method as in claim 1, further comprising providing an indicator responsive to completion of processing of the at least one test vector with the integrated circuit.

3. The method as in claim 1, further comprising waiting for the integrated circuit operation under the free-running clock signal to time out prior to the re-application of the single-step clock signal.

4. A method for testing a design implemented in a programmable logic device, comprising:
 applying a single-step clock signal to an implementation of the design in the programmable logic device;
 loading test vectors into memory of the programmable logic device under control of the single-step clock signal, wherein each test vector is loaded with a separate clock pulse of the single-step clock signal;
 applying a free-running clock signal to the implementation after loading the test vectors, the free-running clock signal being associated with an operating frequency of the integrated circuit;
 operating the implementation using the free-running clock to process the test vectors;
 storing test data responsive to the test vectors processed with the implementation in registers of the programmable logic device;
 re-applying the single-step clock to obtain the test data from the registers; and
 bit-to-bit comparing of the test data with test results from a software simulation of the implementation under control of the single-step clock.

5. The method as in claim 4, further comprising waiting for the implementation operation under the free-running clock to time out prior to re-application of the single-step clock.

6. The method as in claim 4, further comprising providing an indicator responsive to completion of processing of the test vectors with the implementation.

7. The method as in claim 4, further comprising coupling the programmable logic device to a programmed computer.

8. The method as in claim 7, further comprising co-simulating the software simulation with the programmed computer with the hardware implementation in the programmable logic device to obtain the test results and the test data.

9. The method as in claim 8, wherein the programmable logic device is a field programmable gate array integrated circuit.

10. A system for testing an integrated circuit design, comprising:
 a free-running clock signal source;
 a programmable logic device coupled to receive a free-running clock signal from the free-running clock source, the programmable logic device having a programmable logic implementation of the integrated circuit design; and
 a programmed computer coupled to the programmable logic device, the programmed computer configured to control operation of the programmable logic device including control of:
  applying a single-step clock signal to the implementation;
  loading test vectors under control of the single-step clock signal;
  applying the free-running clock signal to the implementation after loading the test vectors, the free-running clock signal being associated with an operating frequency of the integrated circuit;
  waiting for the implementation to process the test vectors using the free-running clock signal; and
  re-applying the single-step clock signal to obtain test data;
 the programmed computer including a software simulation of the integrated circuit design and being programmed to bit-to-bit compare the test data with software simulation test results synchronously with the single-step clock signal.

11. The system as in claim 10, wherein the programmable logic device has a clock signal selection circuit coupled to receive as inputs the single-step clock signal and the free-running clock signal and a selection control circuit to select the single-step clock signal or the free-running clock signal as an output.

12. The system as in claim 11, wherein the clock signal selection circuit is a multiplexer, and wherein the selection control circuit is a first clocked register under control of the programmed computer.

13. The system as in claim 12, wherein the programmable logic device comprises a single-step control circuit for providing the single-step clock signal, and wherein the single-step control circuit is a second clocked register under control of the programmed computer.

14. The system as in claim 13, wherein the programmable logic device comprises memory map and decode logic configured to memory map the first clocked register and the second clocked register.

15. The system as in claim 14, further comprising a test vector generator coupled to the programmable logic device to supply the test vectors to the implementation for loading.

16. The system as in claim 14, wherein the programmable logic device comprises memory to store the test vectors loaded.

17. The system as in claim 10, wherein the programmable logic device comprises registers coupled to store the test data obtained and to provide the test data stored under control of the single-step clock signal.

18. The system as in claim 17, wherein the programmable logic device is a field programmable gate array integrated circuit.

19. A method for testing an implementation of an integrated circuit, comprising:
 obtaining test results from a software simulation of the implementation of the integrated circuit;
 applying a single-step clock signal to the implementation;
 loading test vectors under control of the single-step clock signal for the implementation;
 applying a free-running clock signal to the implementation after loading the test vectors, the free-running clock signal being associated with an operating frequency of the integrated circuit;
 waiting for the implementation to process the test vectors using the free-running clock signal;
 re-applying the single-step clock signal to obtain test data responsive to the test vectors processed by the implementation; and
 comparing the test results and the test data in synchronous bit-to-bit correspondence using the re-applying of the single-step clock signal.

20. A method for co-simulating a software simulation and a hardware implementation of an integrated circuit, comprising:
 applying a single-step clock signal to the software simulation and the hardware implementation;

providing test vectors under control of the single-step clock signal to the software simulation and the hardware implementation;

applying a free-running clock signal to the software simulation and the hardware implementation;

processing the test vectors with the software simulation and the hardware implementation at speed of the free-running clock signal, the free-running clock signal being associated with an operating frequency of the integrated circuit; and re-applying the single-step clock signal to obtain test data responsive to the test vectors processed, wherein the test data from the software simulation and the hardware implementation is synchronously comparable cycle accuracy of the single-step clock signal.

21. A method for testing an integrated circuit, comprising:

obtaining a software simulation of the integrated circuit;

translating the software simulation into a hardware description language version thereof;

synthesizing the hardware description language version into a hardware implementation; and selecting a test mode from a plurality of test modes, wherein the test mode selected:

couples the hardware implementation and the software simulation to a first clock domain for synchronously providing test vectors to the hardware implementation;

decouples the hardware implementation from the first clock domain and couples the hardware implementation to a second clock domain not coupled to the software simulation for processing the test vectors in the second clock domain with the hardware implementation, the second clock domain being orders of magnitude greater in frequency than the first clock domain; and decouples the hardware implementation from the second clock domain and re-couples the hardware implementation to the first clock domain for synchronously obtaining test data responsive to the test vectors processed in the second clock domain;

wherein the first clock domain is a single-step clock domain, the second clock domain is a free-running clock domain, the free-running clock signal being associated with an operating frequency of the integrated circuit.

22. The method as in claim 21, wherein the plurality of test modes further comprise a single-step only clocking test mode and free-running only clocking test mode.

23. A method for testing a hardware implementation of an integrated circuit from a software simulation of the integrated circuit, comprising:

coupling the hardware implementation and the software simulation to a first clock domain for synchronously providing test vectors to the hardware implementation;

decoupling the hardware implementation and the software simulation from the first clock domain and coupling the hardware implementation to a second clock domain not coupled to the software simulation for processing the test vectors in the second clock domain with the hardware implementation, the second clock domain being orders of magnitude greater in frequency than the first clock domain; and decoupling the hardware implementation from the second clock domain and coupling the hardware implementation and the software simulation to a third clock domain for synchronously obtaining test data responsive to the test vectors processed in the second clock domain;

wherein the first clock domain is a single-step clock domain, the second clock domain is a free-running clock domain, the free-running clock signal being associated with an operating frequency of the integrated circuit.

24. The method as in claim 23, wherein the first clock domain and the third clock domain are the same.

* * * * *